United States Patent
Jestin et al.

(10) Patent No.: US 10,505,335 B2
(45) Date of Patent: Dec. 10, 2019

(54) METHOD AND A SYSTEM FOR PULSED EXCITATION OF A NONLINEAR MEDIUM FOR PHOTON PAIR GENERATION

(71) Applicant: INSTITUT NATIONAL DE LA RECHERCHE SCIENTIFIQUE, Quebec (CA)

(72) Inventors: Yoann Jestin, Montreal (CA); Roberto Morandotti, Montreal (CA); Michael Kues, Montreal (CA); Benjamin Wetzel, Montreal (CA); Christian Reimer, Longueuil (CA); Piotr Roztocki, Montreal (CA)

(73) Assignee: Institut National de la Recherche Scientifique, Quebec, Quebec ( * ) Notice: Subject to any disclaimer, the term of this patent is extended or adjusted under 35 U.S.C. 154(b) by 0 days.

(21) Appl. No.: 15/552,061

(22) PCT Filed: Mar. 15, 2016

(86) PCT No.: PCT/CA2016/050285
§ 371 (c)(1),
(2) Date: Aug. 18, 2017

(87) PCT Pub. No.: WO2016/145525
PCT Pub. Date: Sep. 22, 2016

(65) Prior Publication Data
US 2018/0048110 A1 Feb. 15, 2018

Related U.S. Application Data

(60) Provisional application No. 62/135,370, filed on Mar. 19, 2015.

(51) Int. Cl.
*H01S 3/108* (2006.01)
*H01S 3/11* (2006.01)
(Continued)

(52) U.S. Cl.
CPC ........ *H01S 3/1115* (2013.01); *G02B 6/29338* (2013.01); *G02B 6/29341* (2013.01);
(Continued)

(58) Field of Classification Search
CPC ...... H01S 3/108; H01S 3/1083; H01S 3/1109; H01S 5/14; H01S 3/1112; H01S 3/0078;
(Continued)

(56) References Cited

U.S. PATENT DOCUMENTS 5,050,183 A 9/1991 Duling, III
5,365,531 A 11/1994 Lin et al.
(Continued)

OTHER PUBLICATIONS

L. Caspani et al., "Integrated source of multiplexed photon pairs", Optical Society of America, CLEO:2014.*
(Continued)

*Primary Examiner* — Xinning (Tom) Niu
(74) *Attorney, Agent, or Firm* — Lavery, De Billy, LLP; Gwendoline Bruneau

(57) ABSTRACT

A method and a system for pulsed excitation of a nonlinear medium for photon pair generation, he method comprising exciting a single narrow resonance of a nonlinear resonant element with a pulsed laser field, comprising embedding a nonlinear resonant element directly into an external laser cavity and locking the cavity modes.

20 Claims, 3 Drawing Sheets

(51) Int. Cl.
*H01S 3/067* (2006.01)
*G02B 6/293* (2006.01)
*H01S 5/14* (2006.01)
*H01S 3/00* (2006.01)

(52) U.S. Cl.
CPC .......... *H01S 3/06791* (2013.01); *H01S 3/108* (2013.01); *H01S 3/1083* (2013.01); *H01S 3/1109* (2013.01); *H01S 3/1112* (2013.01); *H01S 5/14* (2013.01); *H01S 3/0078* (2013.01); *H01S 3/06754* (2013.01)

(58) Field of Classification Search
CPC ............ H01S 3/06754; G02B 6/29338; G02B 6/29341
See application file for complete search history.

(56) References Cited

U.S. PATENT DOCUMENTS

| | | | |
|---|---|---|---|
| 5,812,567 A | 9/1998 | Jeon et al. | |
| 5,898,716 A | 4/1999 | Ahn et al. | |
| 6,897,434 B1 | 5/2005 | Kumar et al. | |
| 7,817,684 B2 | 10/2010 | Nicholson | |
| 8,014,428 B2 | 9/2011 | Fleming et al. | |
| 8,222,623 B2 | 7/2012 | Trojek et al. | |
| 2011/0142088 A1 | 6/2011 | Winkelnkemper et al. | |
| 2015/0071322 A1* | 3/2015 | Haensel | H01S 3/06791 372/107 |

OTHER PUBLICATIONS

Ippen., "Principles of passive mode locking", Appl. Phys. B 58,159-170 (1994).*

M. Peccianti et al., "Demonstration of a stable ultrafast laser based on a nonlinear microcavity", Nat. Commun. 3, 765 (2012).*

C. Reimer et al., "Integrated frequency comb source of heralded single photons", Opt. Express 22, pp. 6535-6546, 2014 (Year: 2014).*

Ippen., "Principles of passive mode locking", Appl. Phys. B 58,159-170 (1994). (Year: 1994).*

* cited by examiner

METHOD AND A SYSTEM FOR PULSED EXCITATION OF A NONLINEAR MEDIUM FOR PHOTON PAIR GENERATION

CROSS-REFERENCE TO RELATED APPLICATIONS

This application is a National Entry Application of PCT application no PCT/CA2016/050285 filed on Mar. 15, 2016 and published in English under PCT Article 21(2) as WO 2016/145525, which itself claims benefit of U.S. provisional application Ser. No. US 62/135,370, filed on Mar. 19, 2015. All documents above are incorporated herein in their entirety by reference.

FIELD OF THE INVENTION

The present invention relates to a system and method of pulsed excitation of a resonant nonlinear medium. More precisely, the present invention relates to a method and a system of pulsed excitation of a resonant nonlinear medium for photon pair generation.

BACKGROUND OF THE INVENTION

Correlated photon pair emission is a prerequisite for the realization of entangled photon sources in various forms such as polarization entanglement, time-energy entanglement and time-bin entanglement, which form one of the key building blocks for applications in quantum information processing and computing [1], quantum communication [2], as well as imaging and sensing with resolutions exceeding the classical limit [3]. The generation of correlated photon pairs in various forms has been demonstrated through spontaneous parametric down-conversion (SPDC) in a diverse range of second-order nonlinear media [1a] and through spontaneous four wave-mixing (SFWM) within third-order nonlinear media [2a, 3a, 4a, 5a, 6a, 5, 7a].

To deliver the compactness, scalability and efficiency required by future optical quantum circuit devices, solutions focusing on an integrated on-chip approach have been recently studied and developed, including integrated quantum circuits, sources [5a, 6a, 5, 7a] and detectors [4]. The use of nonlinear micro cavities [5, 6] with narrow resonances and high Q-factors, i.e. below threshold pumped high-Q optical parametric oscillators, are of special interest since, in contrast to waveguides, such nonlinear micro cavities offer an enhancement in photon pair generation efficiency as well as a narrow photon pair bandwidth, rendering them compatible with quantum optical devices such as quantum memories for example. More importantly, resonant nonlinear cavities such as integrated ring resonators offer the possibility of generating correlated photon pairs on multiple signal/idler frequency channels [16] due to their periodic resonance structures. This multi-channel characteristic is beneficial for advances in quantum information processing, i.e. generating large quantum states for computation or realizing parallel operations.

Besides, the generation of quantum correlated and entangled photon pairs [16] through spontaneous four wave-mixing resonant nonlinear elements such as nonlinear microring resonators finds many applications in the generation of optical frequency combs [14, 15]. As the resonance bandwidths are very narrow, they are usually excited using a continuous wave (CW) laser with a spectral bandwidth smaller than that of the resonance [14-16].

Specifically, exciting a narrow resonance with an external laser is more efficient if a continuous wave (CW) laser is used, as the pump laser has a narrower spectral bandwidth than the resonance, therefore allowing high power transfer to the resonance [14-17]. However, with a continuous wave (CW) laser it is not possible to predict the time when photon pairs are generated, and defining an electronic system trigger for the synchronization with other components such as optical modulators is typically not possible. Pumping with a pulsed source is therefore desirable for many applications as it allows synchronizing the system to the repetition rate of the pump laser and thus to the generated photon pairs.

Furthermore, the optical quantum properties of the generated photon pairs rely on the pump configuration. If the resonator is pumped with a continuous wave (CW) laser, the generated photon pairs are not single-frequency mode and thus not pure [18] since the excitation bandwidth is not equal to the phase-matching bandwidth, leading to the often undesired generation of non-separable, i.e. frequency-entangled, states [15a] within a single resonance. Photons with high purity are generated only if the spectral bandwidth of the excitation field, in addition to being Fourier-limited, is perfectly matched to the bandwidth of the generated photons [15a], which can only be the case for a pulsed excitation.

Photons with high purity are generated only if the spectral bandwidth of the excitation field is perfectly matched to the bandwidth of the generated photons, which is the case with a pulsed excitation.

Exciting a narrow resonance efficiently with an external pulsed laser is very difficult to accomplish. A slight central frequency and/or bandwidth mismatch between the laser and the resonance deteriorates the coupling efficiency, with the result that most of the power is not coupled into the resonance and therefore unused and lost. In addition, the unused optical power counts towards the damage threshold of the device, often posing a limit to the available input power. Even more importantly, this type of excitation possesses inherent instabilities due to environmental or optically-induced thermal fluctuations, responsible for spectral shifts of resonance frequency and leading to detrimental effects in the photon pair generation rate, photon purity, etc. Furthermore, narrow spectral bandwidth pulsed lasers, i.e. in the 100 MHz range, are very difficult to realize, and, even if realized, using a narrow external laser moreover requires active locking of the laser frequency to the resonator in order to reach practical emission characteristics, which greatly increases complexity.

SUMMARY OF THE INVENTION

More specifically, in accordance with the present invention, there is provided a method for exciting a single narrow resonance of a nonlinear resonant element with a pulsed laser field, comprising embedding a nonlinear resonant element directly into an external laser cavity and locking the cavity modes.

There is further provided a method for pulsed excitation of a nonlinear resonant element for the generation of photon pairs, comprising embedding a nonlinear resonant element directly into an external laser cavity and locking the cavity modes.

There is further provided a system for pulsed excitation of a nonlinear resonant element, comprising an external laser cavity and a nonlinear resonant element, the nonlinear resonant element being directly embedded within the external laser cavity.

There is further provided an intra-cavity pulsed pumped optical parametric oscillator, comprising an external laser cavity and a nonlinear resonant element, the nonlinear resonant element being directly embedded within the external laser cavity.

Other objects, advantages and features of the present invention will become more apparent upon reading of the following non-restrictive description of specific embodiments thereof, given by way of example only with reference to the accompanying drawings.

DESCRIPTION OF ILLUSTRATIVE EMBODIMENTS

The present invention is illustrated in further details by the following non-limiting examples.

The present invention provides the direct integration of a nonlinear resonant element into the laser system, i.e. in such a way that the nonlinear resonant element is part of the laser cavity, and the use of a mode-locking method to reach stable pulsed excitation of a single resonance.

The nonlinear resonant element embedded in the laser cavity acts as a bandwidth filter limiting, in combination with a broader band pass filter selecting one resonance, optical gain to a single resonance. Any passive or active approach can be used to lock the cavity modes to enable stable mode-locking operation. The nonlinear effect within the resonant nonlinear medium, i.e. spontaneous four-wave mixing, is used for the generation of photon pairs.

The nonlinear resonant element may be a nonlinear optical guided loop, a micro-toroid resonator, a micro-sphere resonator, a nonlinear Fabry-Perot cavity, a nonlinear Ikeda cavity, and a whispering gallery mode resonator.

Passive mode-locking achieves the generation of a stable pulsed operation without requiring active control. This can be achieved through the nonlinear response characteristics of saturable absorbers [12a], nonlinear Kerr lenses [13a], or nonlinear loop mirrors [14a], nonlinear polarization rotation, additive pulse-mode-locking among, etc.

Thus, a particular implementation of passive mode-locking can be achieved by placing the resonant nonlinear element inside a figure-8 optical cavity and exploiting a passive nonlinear amplifying loop mirror (NALM) configuration, where the nonlinear cavity is placed in the nonlinear loop mirror part. Thus the nonlinear resonant element is responsible for the nonlinear phase shift to reach NALM mode-locking and the generation of photon pairs.

Figure 1:
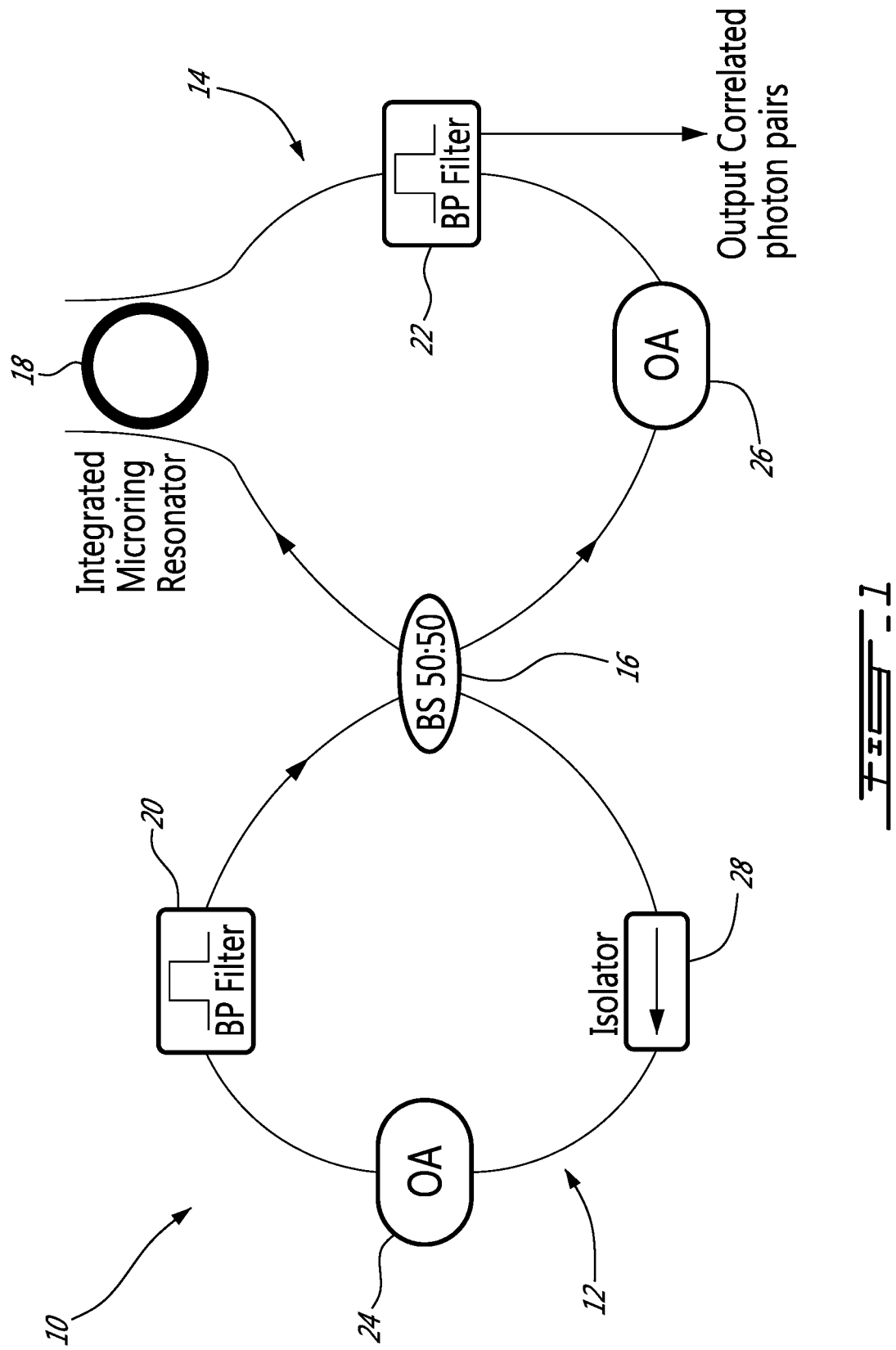
FIG. 1 is a diagrammatic view of a passive mode-locked system according to an embodiment of an aspect of the present invention

An example of a passive mode-locking method and system using a passive nonlinear amplifying loop mirror (NALM) is illustrated for example in FIG. 1.

The system 10 comprises an amplification loop 12 and a nonlinear amplifying loop mirror 14 coupled together by a (50:50) beam splitter 16 so as to define a figure-8 optical path in which a light beam propagating towards the beam splitter 16 in one of the loops 12, 14 is split by the beam splitter 16 to form two light beams propagating in opposite directions around the other one of the loops 12, 14. The amplification loop 12 comprises an isolator 28, i.e. a direction dependent loss element for reducing the intensity of light propagating in a predetermined direction around the first loop 12 and thus ensuring unidirectional propagation. The nonlinear optical loop 14 comprises a resonant nonlinear medium 18, i.e. having an intensity dependent nonlinear optical transmission characteristic, such as a microring resonator for example. At least the nonlinear optical loop 14 comprises an optical gain medium 26.

The beam splitter 16 and the amplification loop 12 form a linear unidirectional loop, providing feedback in the nonlinear amplifying loop mirror (NALM) section 14 of the laser. As light propagates through the system 10, light entering the beam splitter 16 is split equally into clockwise and counter-clockwise propagating beams within the nonlinear amplifying loop mirror (NALM) loop 14. Counter-clockwise propagating light is first amplified before it enters the resonant nonlinear element 18, while clockwise light passes the resonant nonlinear element 18 first and is then amplified. The amplified beams return to the beam splitter 16 at the same amplitude, but one beam has acquired a nonlinear phase shift relative to the other, achieved by the resonant nonlinear medium 18.

This intensity dependent nonlinear phase shift difference between the two arms at the 50:50 beam splitter 16 enables the light splitting ratio to be controlled by the intensity: it causes the high intensity portions of the beams to be transmitted through the beam splitter 16, while the low intensity portions are reflected back in the directions the beams entered beam splitter 16. Thus, the intensity-dependent nonlinear phase shift difference between the two arms at the 50:50 beam splitter 16 results in an intensity dependent splitting ratio, forming a saturable absorber, which favors the transmission and subsequent amplification of the high intensity portions of the light, resulting in mode-locking of the system 10. Such a NALM mimics a saturable absorber allowing passive mode-locking of the system emitting nearly Fourier-bandwidth limited pulses, and subsequently the optimal pulsed excitation of the embedded nonlinear resonant element.

Bandpass filters 20, 22 are used to filter the amplified spontaneous emission (ASE) noise of optical amplifiers 24, 26 respectively, in order to select the desired resonance of the resonant nonlinear structure 18. As only a small amplification is required, standard semiconductor optical amplifiers (SOA) or standard Erbium doped fiber amplifier (EDFA) may be used as the gain medium 24, 26

The spectral filter 22 is used to filter out the photon pairs generated through spontaneous four wave-mixing within the nonlinear resonant medium.

The photon pairs are generated by the nonlinear process acting within the resonant nonlinear element as well known in the art. Specifically, two photons of the excitation field are annihilated and two daughter photons, referred to respectively as the signal photon and the idler photon, are generated on resonances of the nonlinear cavity that are spectrally symmetric to the excitation field. The generation process is non-deterministic, meaning that a photon pair can be generated by any pulse, but it is not possible to decide in advance which pulse generates the pair. In order to limit the generation of multiple pairs within the same pulse, the power of the excitation field is selected in such a way that for example only one photon pair is generated on average every ten to hundred pulses.

The system as illustrated in FIG. 1 for example allows pulsed pumping of a narrow bandwidth resonator with bandwidth matched pulses as well as overcoming limitations regarding transform limited pulses, size, and power consumption, by using a resonant nonlinear medium within a NALM. The use of such a polarization maintaining resonator within the cavity offers a significant nonlinear cavity enhancement, thus reducing the amount of power required to achieve mode-locking by nonlinear phase shift, while shortening the length of the nonlinear device, yielding higher repetition rates and subsequently an enhanced photon flux of the generated photon pairs.

Instead of exploiting a passive mode-locking scheme, active mode-locking can also be exploited to enable stable operation in order to achieve the pulsed bandwidth-matched excitation of a resonance. Thus, according to another embodiment of the present invention, there is provided an active mode-locking method and system, using an intensity or phase modulator to achieve the pulsed bandwidth-matched excitation of a resonance.

Figure 2:
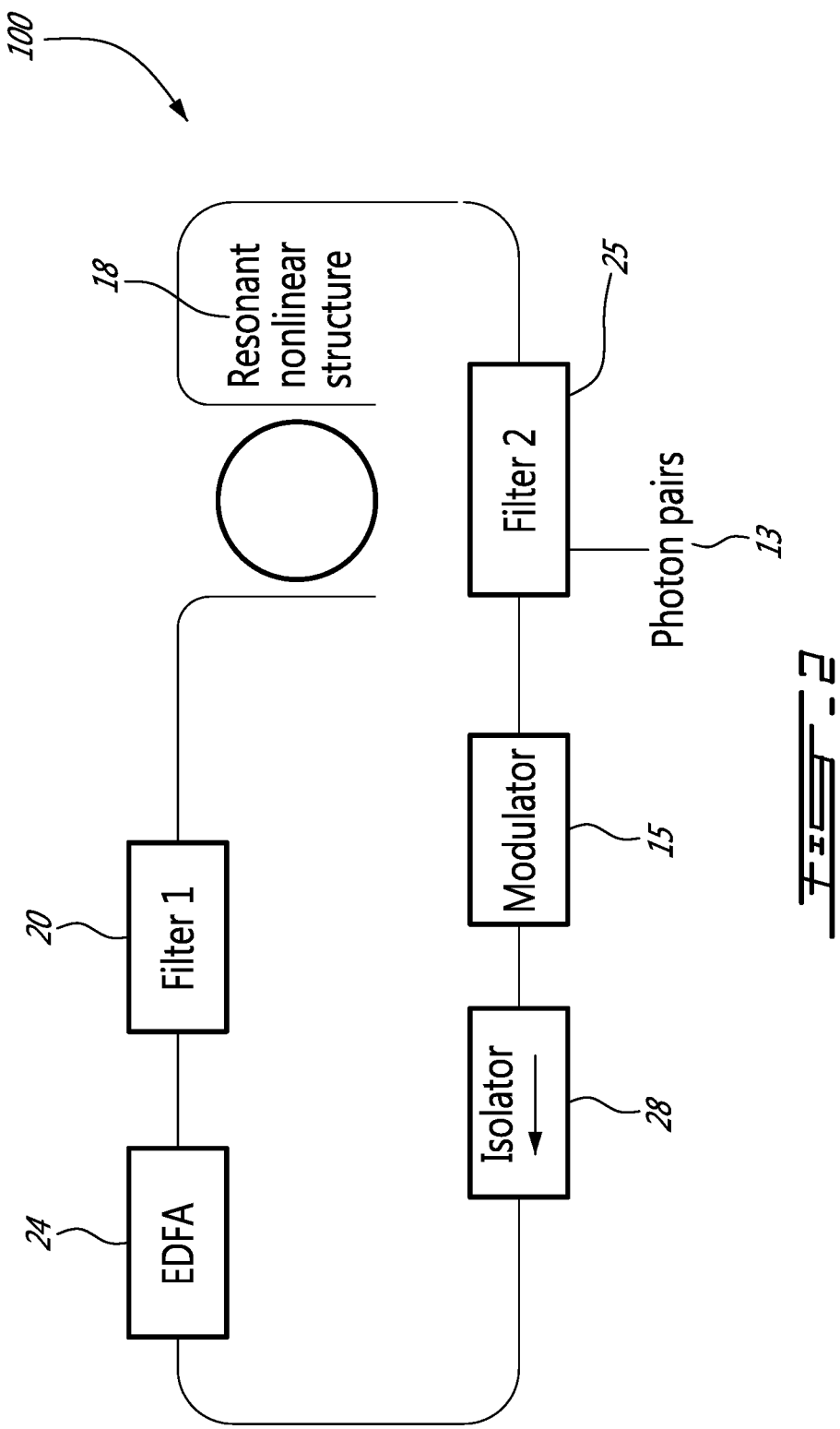
FIG. 2 is a diagrammatic view of an active mode-locked system according to an embodiment of an aspect of the present invention.

In the system 100 illustrated for example in FIG. 2, the resonant nonlinear medium 18, such as a ring resonator, is incorporated in a standard fiber ring cavity, gain is supported by an amplifying element 24 such as an erbium doped fiber amplifier for example, a filter 20 is used to limit the spectral gain to a single ring resonance, and an isolator 28 assures the unidirectional operation of the laser. A phase or amplitude modulator 15 is operated at a frequency matching the free spectral range of the external cavity. Precisely selecting modulation amplitude leads to the locking of the external cavity modes, yielding a pulsed actively mode-locked laser operation [9a, 10a, 11a]. The spectral bandwidth of the laser is limited by the ring resonance bandwidth, i.e. between 150-600 MHz for example. Such a system thus allows an efficient pulsed excitation of the resonant nonlinear medium 18. A frequency filter 25 is used to filter the pump frequency components from the rest of the electro-magnetic spectrum, allowing photon pairs that are generated in the ring resonator 18 to be routed to a different output.

Both systems illustrated in FIGS. 1 and 2 for example form an intra-cavity pulsed pumped optical parametric oscillator (OPO), i.e. an OPO directly built into the pump laser. Below threshold operation of the OPO, the present systems have thus the possibility of generating directly quantum correlated photon pairs from a pulsed excitation.

There is thus provided a method to excite a resonant nonlinear element with bandwidth-matched pulses, which are directly matched to the central frequency and bandwidth of the resonant nonlinear element without the need for any active locking or stabilization.

For the use of resonators as single photon sources, narrow bandwidths are desired to enable compatibility with quantum memories, in addition, the sources are required to be pumped in a pulsed configuration to allow synchronization with other devices. The present system and method can allow such characteristics.

Figure 3:
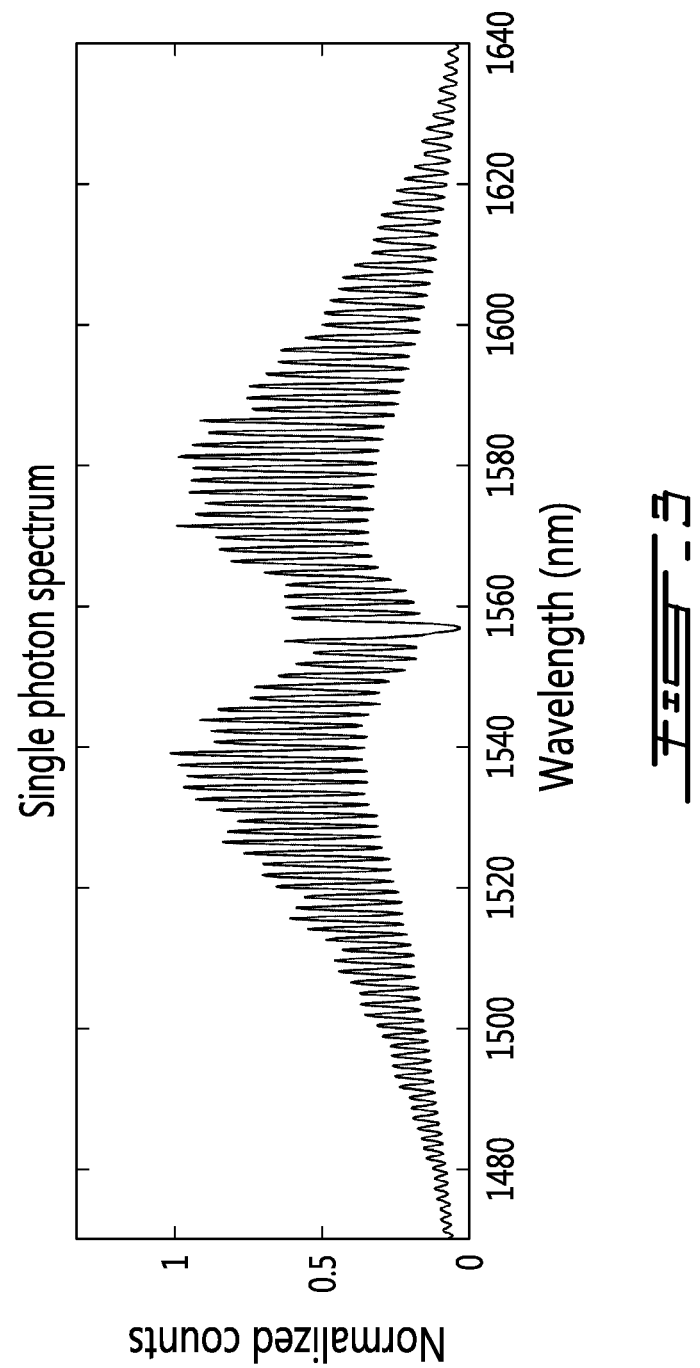
FIG. 3 shows a single photon spectrum emitted by a nonlinear resonant cavity exited at a single resonance according to an embodiment of an aspect of the present invention.

FIG. 3 shows a photon spectrum emitted by an integrated microring resonator-based source. This example spectrum spans several telecommunications bands of interest (S, C, L), and its multiple emission channels are attractive for applications in quantum information processing.

Since in the present invention the resonator is part of the pump laser itself, the pulses are intrinsically bandwidth matched to the resonance. This enables optimum power coupling without the need to lock the resonance to an external pump laser. As the resonator is incorporated into the external laser cavity, the excitation frequency inherently follows any drifts of the ring resonance, such as due to thermal effects for example, thus precluding the use of typically required stabilization schemes.

There is thus provided a method and a system method of pulsed excitation of nonlinear resonant elements for the generation of photon pairs, comprising directly embedding the nonlinear resonant elements into the external laser cavity, thereby allowing stable operation, even when the resonance frequency shifts due to environmental conditions, since the central frequency of the lasing modes follows the spectral resonance shifts. The excitation field is automatically bandwidth-matched to the resonance of the nonlinear element, leading to the generation of frequency single-mode photons (perfectly separable two-photon state). The resonance structure of the nonlinear resonant element allows for frequency-multiplexed photon pair generation. The method directly assures an optimal energy coupling to the resonant element, i.e. no energy is wasted on spectral components not coupled to the resonator. The method allows the synchronization to electronic systems required for signal processing, such as manipulation and detection. Passive, i.e. self-starting, mode-locking allows for reduced complexity, footprint as well as stand-alone (turn-key) operation.

The scope of the claims should not be limited by the preferred embodiments set forth in the examples, but should be given the broadest interpretation consistent with the description as a whole.

REFERENCES

[1] P. Walther et al., "Experimental one-way quantum computing," Nature 434, 169 (2005).
[2] H. J. Kimble, "The quantum internet," Nature 453, 1023 (2008).
[3] M. Kolobov, "The spatial behavior of nonclassical light," Rev. Mod. Phys. 71, 1539 (1999).
[4] D. Bonneau et al., "Silicon quantum photonics," in Silicon Photonics III, L. Pavesi, D. J. Lockwood, Springer, pp. 41-82.
[5] D. Grassani et al., "Micrometer-scale integrated silicon source of time-energy entangled photons," Optica 2, 88 (2015).
[6] C. Reimer et al., "Cross-polarized photon-pair generation and bi-chromatically pumped optical parametric oscillation on a chip," Nature Commun. 6, 8236 (2015).
[14] L. Razzari et al., "CMOS-compatible integrated optical hyper-parametric oscillator," Nat. Phot. 4, 41-45 (2010)
[15] T. Kippenberg et al., "Mircroresonator-based optical frequency combs," Science 332, 555-559 (2011)
[16] C. Reimer et al., "Integrated frequency comb source of heralded single photons," Opt. Express 22, 6535-6546 (2014).
[17] D. J. Moss et al., "New CMOS-compatible platforms based on silicon nitride and Hydex for nonlinear optics," Nat. Phot. 7, 597-607 (2013).
[1a] Kwiat et al., Phys. Rev. Lett. 75, 4337 (1995).
[2a] Takesue et al., Phys. Rev. A 70, 031802(R) (2004).
[3a] Li et al., Phys. Rev. Lett. 94, 053601 (2005).
[4a] Dong et al., Opt. Express 22, 359 (2014).
[5a] Takesue et al., Appl Phys. Lett. 91, 201108 (2007).
[6a] Olislager et al., Opt. Lett. 38, 1960 (2013).
[7a] Wakabayashi et al., Opt. Express 23, 1103 (2015).
[8a] Spring et al., Opt. Express 21, 13522 (2013).

[9a] L. E. Hargrove, R. L. Fork, and M. A. Pollack, "Locking of He—Ne laser modes induced by synchronous intracavity modulation", Appl. Phys. Lett. 5, 4 (1964).

[10a] M. H. Crowell, "Characteristics of mode-coupled lasers", IEEE J. Quantum Electron. 1, 12 (1965)

[11a] Weiner, A. M. (2009) Principles of Mode-Locking, in Ultrafast Optics, John Wiley & Sons, Inc., Hoboken, N.J., USA.

[12a] E. P. Ippen, "Principles of passive mode locking," Appl. Phys. B 58, 159-170 (1994).

[13a] D. E. Spence et al., "60-fsec pulse generation from a self-mode-locked Ti:sapphire laser," Opt. Lett. 16, 4244 (1991).

[14a] S. Min et al., "Semiconductor optical amplifier based high duty-cycle, self-starting figure-eight 1.7 GHz laser source," Opt. Express 17, 6187 (2009).

[15a] D. Bonneau, J. W. Silverstone, M. G. Thompson, in Silicon Photonics III, L. Pavesi, D. J. Lockwood, Eds. (Springer, ed. 3, 2016), pp. 41-82.

The invention claimed is:

1. A method for a pulsed bandwidth-matched excitation of a single narrow resonance of a nonlinear resonant element with a pulsed laser field, comprising embedding a nonlinear resonant element directly into an external laser cavity, selecting one single resonance of the nonlinear resonant element and locking external cavity resonances within the selected resonance of the nonlinear resonant element.

2. A method for a pulsed bandwidth-matched excitation of a nonlinear resonant element for the generation of photon pairs, comprising embedding a nonlinear resonant element directly into an external laser cavity, selecting one single resonance of the nonlinear resonant element and locking external cavity resonances within the selected resonance of the nonlinear resonant element, the photon pairs being generated by a spontaneous nonlinear effect in the nonlinear resonant element.

3. The method of claim 1, comprising selecting a resonant nonlinear element among one of: a nonlinear optical guided loop, a micro-toroid resonator, a micro-sphere resonator, a nonlinear Fabry-Perot cavity, a nonlinear Ikeda cavity, and a whispering gallery mode resonator.

4. The method of claim 1, wherein said locking the cavity modes comprises passive mode-locking the cavity modes.

5. The method of claim 1, wherein said locking the cavity modes comprises using one of: saturable absorbers, nonlinear loop mirrors, nonlinear polarization rotation, additive pulse-mode-locking and nonlinear Kerr lenses.

6. The method of claim 1, comprising placing the nonlinear resonant element inside a nonlinear amplifying loop mirror section of a figure-8 optical cavity and selecting a single nonlinear cavity resonance in a nonlinear amplifying loop mirror configuration.

7. The method of claim 1, wherein said locking the cavity modes comprises active mode-locking the cavity modes.

8. The method of claim 1, wherein said locking the cavity modes comprises using an active intensity or phase modulator and selecting a modulation amplitude at a frequency matching a free spectral range of the external cavity.

9. A system for pulsed bandwidth-matched excitation of a single narrow resonance pulsed excitation with a pulsed laser field, comprising an external laser cavity and a nonlinear resonant element, said nonlinear resonant element being directly embedded within said external laser cavity, wherein one single resonance of the nonlinear resonant element is selected and external cavity resonances are locked within the selected resonance of the nonlinear resonant element.

10. The system of claim 9, wherein the resonant nonlinear element is one of: a nonlinear optical guided loop, a micro-toroid resonator, a micro-sphere resonator, a nonlinear Fabry-Perot cavity, a nonlinear Ikeda cavity, and a whispering gallery mode resonator.

11. The system of claim 9, further comprising a mode-locking section.

12. The system of claim 9, comprising one of: saturable absorbers, nonlinear loop mirrors, nonlinear polarization rotation, additive pulse-mode-locking and nonlinear Kerr lenses.

13. The system of claim 9, comprising a modulator.

14. An intra-cavity pulsed pumped optical parametric oscillator, comprising an external laser cavity and a nonlinear resonant element, said nonlinear resonant element being directly embedded within said external laser cavity, wherein one single resonance of the nonlinear resonant element is selected and external cavity resonances are locked within the selected resonance of the nonlinear resonant element.

15. The method of claim 2, comprising selecting a resonant nonlinear element among one of: a nonlinear optical guided loop, a micro-toroid resonator, a micro-sphere resonator, a nonlinear Fabry-Perot cavity, a nonlinear Ikeda cavity, and a whispering gallery mode resonator.

16. The method of claim 2, wherein said locking the cavity modes comprises passive mode-locking the cavity modes.

17. The method of claim 2, wherein said locking the cavity modes comprises using one of: saturable absorbers, nonlinear loop mirrors, nonlinear polarization rotation, additive pulse-mode-locking and nonlinear Kerr lenses.

18. The method of claim 2, comprising placing the nonlinear resonant element inside a nonlinear amplifying loop mirror section of a figure-8 optical cavity and selecting a single nonlinear cavity resonance in a nonlinear amplifying loop mirror configuration.

19. The method of claim 2, wherein said locking the cavity modes comprises active mode-locking the cavity modes.

20. The method of claim 2, wherein said locking the cavity modes comprises using an active intensity or phase modulator and selecting a modulation amplitude at a frequency matching a free spectral range of the external cavity.

* * * * *